(12) United States Patent
Hihara

(10) Patent No.: US 11,899,062 B2
(45) Date of Patent: Feb. 13, 2024

(54) BASIC LOGIC ELEMENT, SEMICONDUCTOR DEVICE INCLUDING THE SAME, OUTPUT CONTROL METHOD FOR BASIC LOGIC ELEMENT, AND NON-TRANSITORY COMPUTER READABLE MEDIUM

(71) Applicant: NEC Space Technologies, Ltd., Fuchu (JP)

(72) Inventor: Hiroki Hihara, Tokyo (JP)

(73) Assignee: NEC SPACE TECHNOLOGIES, LTD., Tokyo (JP)

( * ) Notice: Subject to any disclaimer, the term of this patent is extended or adjusted under 35 U.S.C. 154(b) by 87 days.

(21) Appl. No.: 17/605,637

(22) PCT Filed: Dec. 24, 2019

(86) PCT No.: PCT/JP2019/050633
§ 371 (c)(1),
(2) Date: Oct. 22, 2021

(87) PCT Pub. No.: WO2020/217589
PCT Pub. Date: Oct. 29, 2020

(65) Prior Publication Data
US 2022/0206066 A1 Jun. 30, 2022

(30) Foreign Application Priority Data
Apr. 26, 2019 (JP) .................. 2019-085330

(51) Int. Cl.
*G01R 31/3177* (2006.01)
*G01R 31/317* (2006.01)
(Continued)

(52) U.S. Cl.
CPC ......... *G01R 31/3177* (2013.01); *G01R 31/28* (2013.01); *G01R 31/3187* (2013.01);
(Continued)

(58) Field of Classification Search
CPC ......... G01R 31/3177; G01R 31/31724; G01R 31/318519; G01R 31/3187; G01R 31/28;
(Continued)

(56) References Cited

U.S. PATENT DOCUMENTS

| 2013/0166978 A1* | 6/2013 | Itozawa | ......... G01R 31/318586 |
| | | | 714/727 |
| 2017/0285106 A1* | 10/2017 | Maeda | ............. G01R 31/31813 |

(Continued)

FOREIGN PATENT DOCUMENTS

| JP | H08-314744 A | 11/1996 |
| JP | 2000-147058 A | 5/2000 |

(Continued)

OTHER PUBLICATIONS

International Search Report for PCT Application No. PCT/JP2019/050633, dated Apr. 7, 2020.

(Continued)

*Primary Examiner* — John J Tabone, Jr.

(57) ABSTRACT

A basic logic element includes: a calculation unit configured to perform calculation processing; a self-diagnosis unit configured to self-diagnose whether or not there is an abnormality in a result of the calculation output from the basic logic element; a management unit configured to determine whether or not to retain authority to output the result of the calculation based on a result of the diagnosis performed by the self-diagnosis unit and output a result of the determination as an authority signal; and an output control unit configured to control whether or not to output the result of the calculation performed by the calculation unit based on whether or not the authority to output data is retained by the management unit.

18 Claims, 7 Drawing Sheets

(51) Int. Cl.
*G01R 31/3185* (2006.01)
*G01R 31/3187* (2006.01)
*G01R 31/28* (2006.01)
*G06F 11/16* (2006.01)
*H01L 21/82* (2006.01)
*H01L 21/822* (2006.01)
*H01L 27/04* (2006.01)

(52) U.S. Cl.
CPC .............. *G01R 31/31724* (2013.01); *G01R 31/318519* (2013.01); *G06F 11/16* (2013.01); *H01L 21/82* (2013.01); *H01L 21/822* (2013.01); *H01L 27/04* (2013.01)

(58) Field of Classification Search
CPC ........ G06F 11/16; H01L 21/82; H01L 21/822; H01L 27/04
USPC ........................................................ 714/724
See application file for complete search history.

(56) References Cited

U.S. PATENT DOCUMENTS

| | | | |
|---|---|---|---|
| 2021/0096182 A1* | 4/2021 | Chakraborty | G01R 31/3177 |
| 2021/0263483 A1* | 8/2021 | Masuzaki | G05B 23/0237 |
| 2022/0206066 A1* | 6/2022 | Hihara | H01L 27/04 |

FOREIGN PATENT DOCUMENTS

| | | | |
|---|---|---|---|
| JP | 2000147058 A | * | 5/2000 |
| JP | 2007-323190 A | | 12/2007 |
| JP | 2017162417 A | * | 9/2017 |

OTHER PUBLICATIONS

D. Alnajjar et al., "Reliability-Configurable Mixed-Grained Reconfigurable Array Supporting C-To-Array Mapping and Its Radiation Testing", in Proc. IEEE Asian Solid-State Circuits Conference (A-SSCC), 2013, pp. 313-316.

* cited by examiner

PRIOR ART

BASIC LOGIC ELEMENT, SEMICONDUCTOR DEVICE INCLUDING THE SAME, OUTPUT CONTROL METHOD FOR BASIC LOGIC ELEMENT, AND NON-TRANSITORY COMPUTER READABLE MEDIUM

This application is a National Stage Entry of PCT/JP2019/050633 filed on Dec. 24, 2019, which claims priority from Japanese Patent Application 2019-085330 filed on Apr. 26, 2019, the contents of all of which are incorporated herein by reference, in their entirety.

TECHNICAL FIELD

The present disclosure relates to a basic logic element, a semiconductor device including the same, an output control method for the basic logic element, and a control program.

BACKGROUND ART

In an FPGA, in order to improve reliability thereof, for example, a configuration of a redundancy circuit is used in which a plurality of basic logic elements are caused to perform the same calculation processing and a result of the calculation of a value having a majority of the results of the calculation is adopted as a formal result of the calculation. Note that FPGA is an abbreviation for Field Programmable Gate Array. Further, the basic logic element is also referred to as a BLE.

Non Patent Literature 1 discloses a related technique. The redundancy circuit disclosed in Non Patent Literature 1 includes a plurality of calculation circuits that perform the same calculation processing in parallel, and a majority circuit that selects a result of the calculation of a value having a majority of the results of the calculation performed by the plurality of calculation circuits and outputs the selected result of the calculation.

CITATION LIST

Non Patent Literature

Non Patent Literature 1: D. Alnajjar, H. Konoura, Y. Mitsuyama, H. Shimada, K. Kobayashi, H. Kanbara, H. Ochi, T. Imagawa, S. Noda, K. Wakabayashi, M. Hashimoto, T. Onoye, and H. Onodera, "Reliability-Configurable Mixed-Grained Reconfigurable Array Supporting C-To-Array Mapping and Its Radiation Testing", in Proc. IEEE A-SSCC, 2013, pp. 313-316.

SUMMARY OF INVENTION

Technical Problem

However, in the configuration of the redundancy circuit disclosed in Non Patent Literature 1, when an abnormality (a failure) has occurred in the majority circuit which is a single failure point where the results of the calculation performed by the plurality of calculation circuits are concentrated, a correct result of the calculation cannot be output. That is, there is a problem that by the configuration of the redundancy circuit disclosed in Non Patent Literature 1, reliability of a circuit still cannot be improved.

An object of the present disclosure is to provide a basic logic element, a semiconductor device including the same, an output control method for the basic logic element, and a control program that solve the above-described problem.

Solution to Problem

According to an example embodiment, a basic logic element includes: a calculation unit configured to perform calculation processing; a self-diagnosis unit configured to self-diagnose whether or not there is an abnormality in a result of the calculation output from the basic logic element; a management unit configured to determine whether or not to retain authority to output the result of the calculation based on a result of the diagnosis performed by the self-diagnosis unit and output a result of the determination as an authority signal; and an output control unit configured to control whether or not to output the result of the calculation performed by the calculation unit based on whether or not the authority to output the result of the calculation is retained by the management unit.

According to an example embodiment, a semiconductor device includes a plurality of basic logic elements provided in parallel, each of the plurality of basic logic elements including: a calculation unit configured to perform calculation processing; a self-diagnosis unit configured to self-diagnose whether or not there is an abnormality in a result of the calculation output from the basic logic element; a management unit configured to determine whether or not to retain authority to output the result of the calculation based on a result of the diagnosis performed by the self-diagnosis unit and output a result of the determination as an authority signal; and an output control unit configured to control whether or not to output the result of the calculation performed by the calculation unit based on whether or not the authority to output the result of the calculation is retained by the management unit.

According to an example embodiment, an output control method for a basic logic element includes: performing calculation processing; self-diagnosing whether or not there is an abnormality in a result of the calculation; determining whether or not to retain authority to output the result of the calculation based on a result of the diagnosis and outputting a result of the determination as an authority signal; and controlling whether or not to output the result of the calculation based on whether or not the authority to output the result of the calculation is retained.

According to an example embodiment, a control program causes a computer to execute processing for constituting a predetermined circuit by combining a plurality of basic logic elements, each of the plurality of basic logic elements including: a calculation unit configured to perform calculation processing; a self-diagnosis unit configured to self-diagnose whether or not there is an abnormality in a result of the calculation output from the basic logic element; a management unit configured to determine whether or not to retain authority to output the result of the calculation based on a result of the diagnosis performed by the self-diagnosis unit and output a result of the determination as an authority signal; and an output control unit configured to control whether or not to output the result of the calculation performed by the calculation unit based on whether or not the authority to output the result of the calculation is retained by the management unit.

Advantageous Effects of Invention

According to the example embodiments, it is possible to provide a basic logic element, a semiconductor device including the same, an output control method for the basic logic element, and a control program that are capable of improving reliability of a circuit.

BRIEF DESCRIPTION OF DRAWINGS

FIG. 6 is a block diagram showing an configuration example of a basic logic element according to a concept conceived of before the first example embodiment was conceived of.

DESCRIPTION OF EMBODIMENTS

Figure 1:
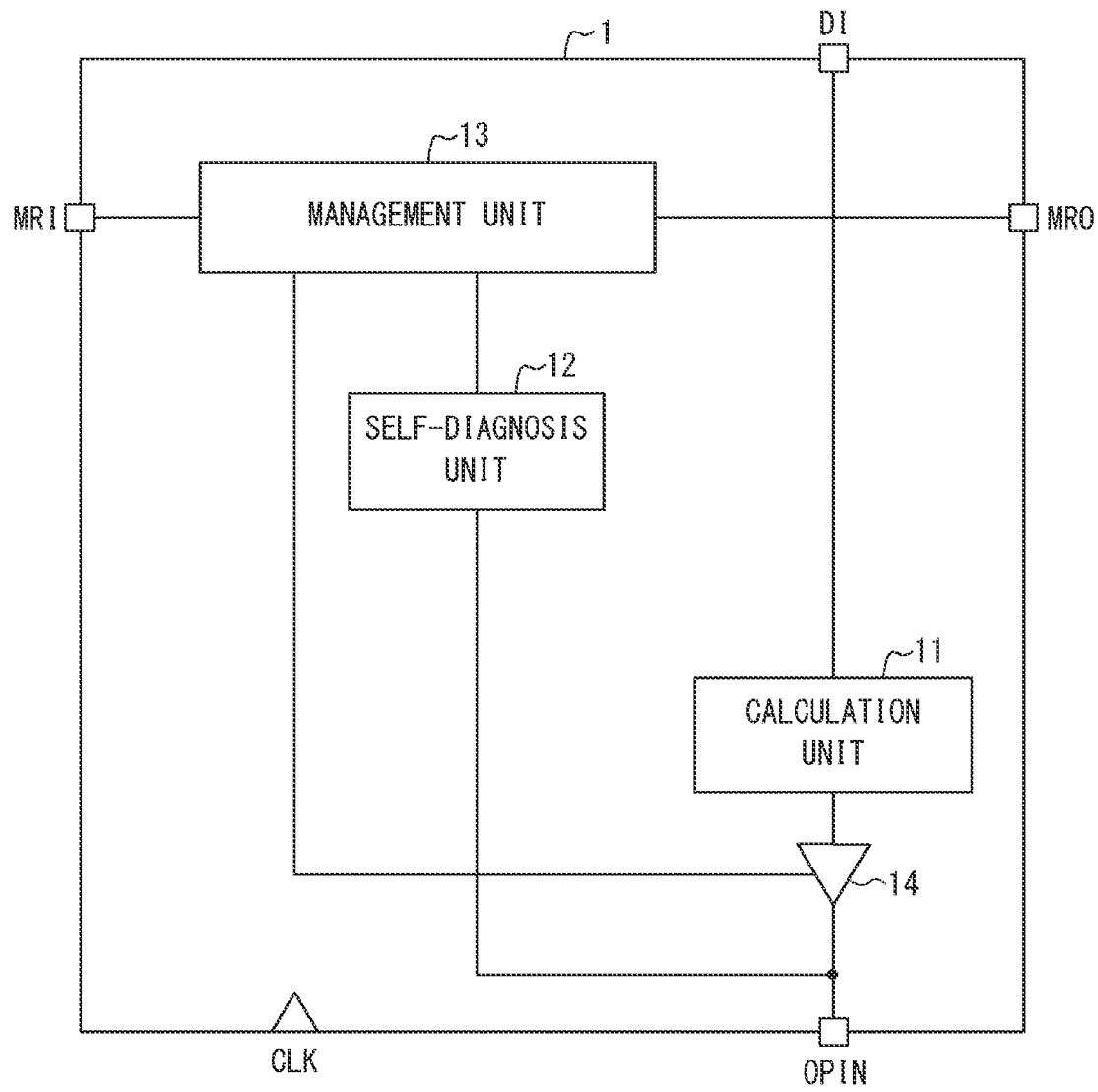
FIG. 1 is a block diagram showing a configuration example of a basic logic element according to a first example embodiment.

Example embodiments will be described hereinafter with reference to the drawings. Note that since the drawings are drawn in a simplified manner, the technical scope of the example embodiments should not be narrowly interpreted based on the descriptions of the drawings. Further, the same elements are denoted by the same reference numerals or symbols, and redundant descriptions thereof will be omitted.

In the following example embodiments, when necessary, the present disclosure is explained by using separate sections or separate example embodiments. However, those example embodiments are not unrelated with each other, unless otherwise specified. That is, they are related in such a manner that one example embodiment is a modified example, an application example, a detailed example, or a supplementary example of a part or the whole of another example embodiment. Further, in the following example embodiments, when the number of elements or the like (including numbers, values, quantities, ranges, and the like) is mentioned, the number is not limited to that specific number except for cases where the number is explicitly specified or the number is obviously limited to a specific number based on its principle. That is, a larger number or a smaller number than the specific number may also be used.

Further, in the following example embodiments, their components (including operation steps and the like) are not necessarily indispensable except for cases where the component is explicitly specified or the component is obviously indispensable based on its principle. Similarly, in the following example embodiments, when a shape, a position relation, or the like of a component(s) or the like is mentioned, shapes or the likes that are substantially similar to or resemble that shape are also included in that shape except for cases where it is explicitly specified or they are eliminated based on its principle. This is also true for the above-described number or the like (including numbers, values, quantities, ranges, and the like).

<Preliminary Study>

First, a basic logic element and a redundancy circuit including the basic logic element which have been studied in advance by the present inventor will be described.

Figure 6:
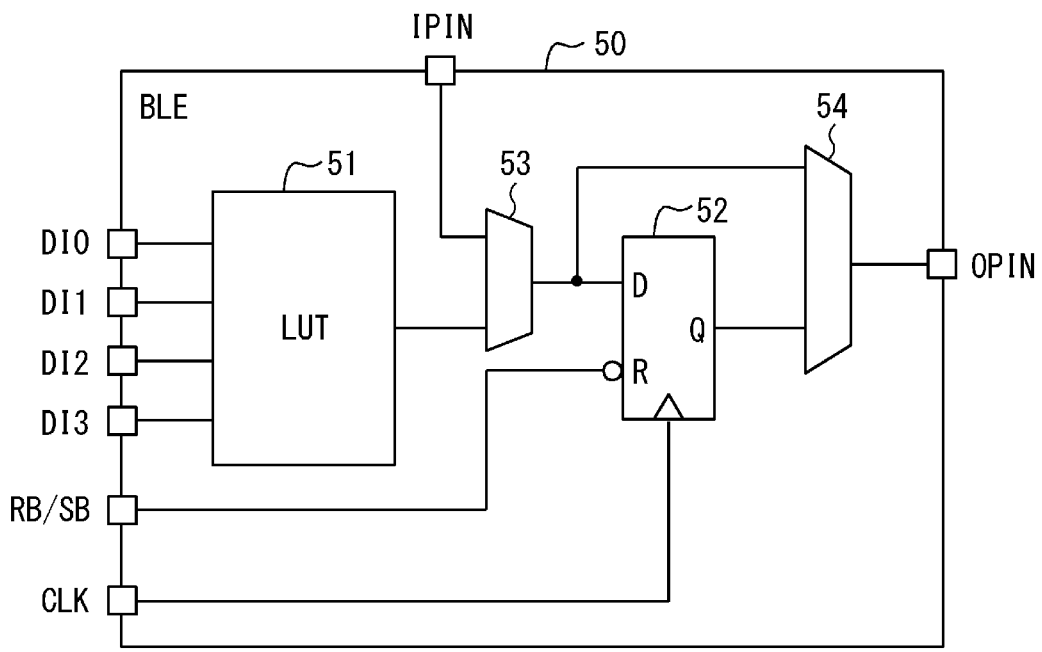

FIG. 6 is a block diagram showing a configuration example of a basic logic element 50 according to a concept conceived of before a first example embodiment was conceived of. The basic logic element 50 shown in FIG. 6 is used, for example, for some or all of a plurality of basic logic elements constituting the FPGA. In the FPGA, the on/offs of a plurality of bus transistors provided on wiring are switched and hence connection relations among the plurality of basic logic elements are switched, whereby a desired circuit configuration is implemented.

Specifically, the basic logic element (BLE) 50 includes a lookup table (LUT) 51, a flip-flop 52, and selectors 53 and 54. The lookup table 51 outputs, for example, values corresponding to input signals DI0 to DI4. The selector 53 selects either an output signal of the lookup table 51 or an input signal IPIN and outputs the selected signal. Note that the input signal IPIN is, for example, an output signal of a basic logic element different from the basic logic element 50 in the case where a plurality of basic logic elements are cascade-connected and used. The flip-flop 52 captures the signal selected by the selector 53 in synchronization with a clock signal CLK and outputs the captured signal. The selector 54 selects either the signal selected by the selector 53 or an output signal of the flip-flop 52 and outputs the selected signal as an output signal OPIN of the basic logic element 50.

«Configuration Example of Redundancy Circuit 500 Using Basic Logic Element 50»

Figure 7:
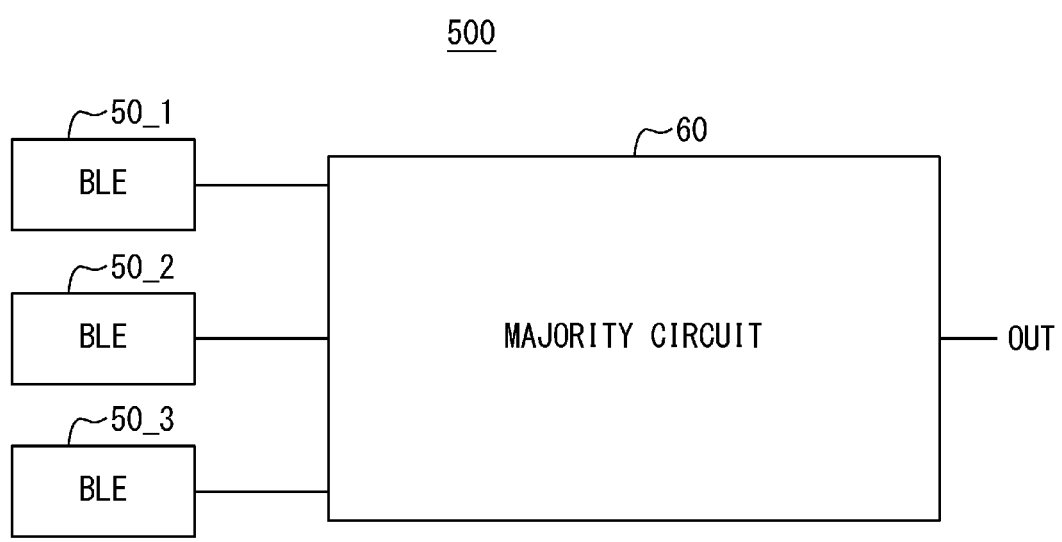
FIG. 7 is a block diagram showing a configuration example of a redundancy circuit using the basic logic element shown in FIG. 6.

FIG. 7 is a block diagram showing a configuration example of a redundancy circuit 500 using the basic logic element 50. The redundancy circuit 500 includes three basic logic elements 50 (hereinafter referred to as basic logic elements 50_1 to 50_3) that perform the same calculation processing in parallel, and a majority circuit 60 that selects an output signal of a value having a majority of the output signals of the basic logic elements 50_1 to 50_3 and outputs the selected output signal. Therefore, even when, for example, the basic logic element 50_1 among the basic logic elements 50_1 to 50_3 fails, the redundancy circuit 500 can adopt, as formal output signals, the output signals of the basic logic elements 50_2 and 50_3 that have not failed. That is, the redundancy circuit 500 can improve reliability of a circuit. Note that, in this example, although a description is given of a case in which three basic logic elements 50 that perform the same calculation processing are provided in the redundancy circuit 500, four or more basic logic elements 50 may be provided as a matter of course.

However, in the configuration of the redundancy circuit 500, when an abnormality (a failure) has occurred in the majority circuit 60 which is a single failure point where the output signals of the basic logic elements 50_1 to 50_3 are concentrated, a correct output signal cannot be output. That is, by the configuration of the redundancy circuit 500, reliability of a circuit still cannot be improved.

Therefore, a basic logic element 1 and a redundancy circuit 100 including the basic logic element 1 according to the first example embodiment have been provided, which basic logic element 1 and redundancy circuit 100 can solve the above problem.

First Example Embodiment

FIG. 1 is a block diagram showing a configuration example of the basic logic element 1 according to the first example embodiment.

The basic logic element 1 shown in FIG. 1 is used, for example, for some or all of a plurality of basic logic elements constituting the FPGA. In the FPGA, the on/offs of a plurality of bus transistors provided on wiring are switched and hence connection relations among the plurality of basic logic elements are switched, whereby a desired circuit configuration is implemented.

Specifically, the basic logic element 1 includes at least a calculation unit 11, a self-diagnosis unit 12, a management unit 13, and an output control unit 14.

The calculation unit 11 performs calculation processing on an input signal DI and outputs a result of the calculation. The calculation unit 11 may, instead of being a lookup table, be a calculator such as a Micro-Controller Unit (MCU), a Digital Signal Processor (DSP), or a Vector Processing Element (VPE).

The self-diagnosis unit 12 diagnoses whether or not there is any abnormality in a result of the calculation output from the basic logic element (the own element) 1 to the outside through an output terminal OPIN. For example, the self-diagnosis unit 12 compares the result of the calculation performed by the calculation unit 11 with the result of the calculation output from the own element to the outside through the output terminal OPIN. Then, when the result of the calculation performed by the calculation unit 11 and the result of the calculation output from the own element to the outside through the output terminal OPIN coincide with each other as a result of the comparison, the self-diagnosis unit 12 diagnoses that there is no abnormality in the result of the calculation output from the own element to the outside through the output terminal OPIN. On the other hand, when the result of the calculation performed by the calculation unit 11 and the result of the calculation output from the own element to the outside through the output terminal OPIN do not coincide with each other as a result of the comparison, the self-diagnosis unit 12 diagnoses that there is an abnormality in the result of the calculation output from the own element to the outside through the output terminal OPIN.

Note that as a method for the self-diagnosis unit 12 to perform a self-diagnosis, various diagnostic methods other than the above-described method may be used. For example, the self-diagnosis unit 12 may respectively accumulate the result of the calculation performed by the calculation unit 11 and the result of the calculation output from the own element to the outside through the output terminal OPIN for a certain period of time and then compare the accumulated results.

The management unit 13 manages whether or not to retain the authority (authority to output data) to output a result of the calculation performed by the own element.

For example, the management unit 13 can obtain the authority to output data by receiving an authority signal MRI indicating that the authority to output data is abandoned (in other words, the authority to output data is transferred) from a first another basic logic element 1. The management unit 13 then determines whether or not to continue retaining the authority to output data based on a result of the self-diagnosis performed by the self-diagnosis unit 12.

For example, when the self-diagnosis unit 12 has diagnosed that there is no abnormality in the result of the calculation of the own element, the management unit 13 continues retaining the authority to output data, while when the self-diagnosis unit 12 has diagnosed that there is an abnormality in the result of the calculation of the own element, the management unit 13 abandons the authority to output data without retaining it. The management unit 13 outputs an authority signal MRO indicating whether or not to retain the authority to output data to a second another basic logic element.

The output control unit 14 is, for example, a tri-state buffer, and controls whether or not to output a result of the calculation performed by the calculation unit 11 to the outside (e.g., a shared bus) of the own element through the output terminal OPIN according to whether or not the authority to output data is retained by the management unit 13.

For example, when the authority to output data is retained by the management unit 13, the output control unit 14 outputs a result of the calculation performed by the calculation unit 11 to the outside of the own element through the output terminal OPIN. On the other hand, when the authority to output data has been abandoned by the management unit 13, the output control unit 14 stops outputting a result of the calculation performed by the calculation unit 11 to the outside of the own element.

«Configuration Example of Redundancy Circuit 100 Using Basic Logic Element 1»

Figure 2:
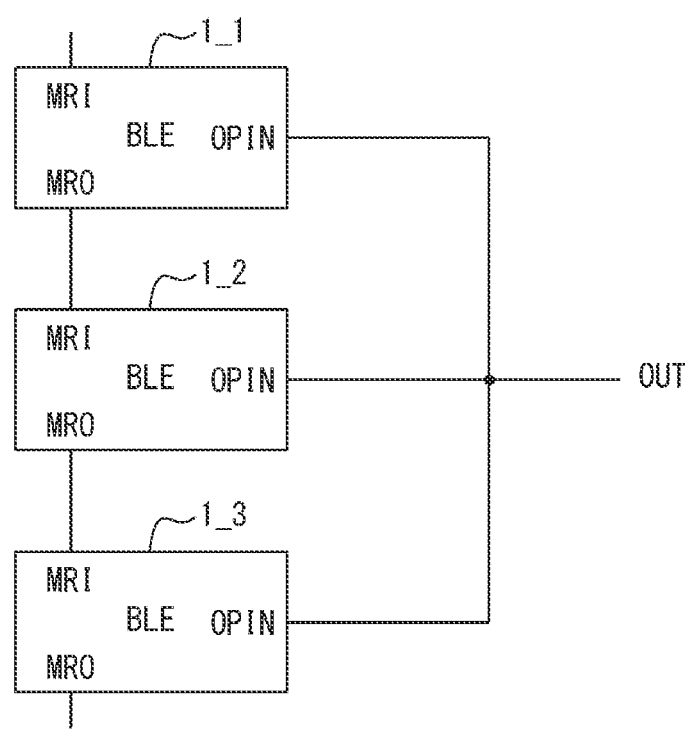
FIG. 2 is a block diagram showing a configuration example of a redundancy circuit using the basic logic element shown in FIG. 1.

FIG. 2 is a block diagram showing a configuration example of the redundancy circuit 100 using the basic logic element 1. The redundancy circuit 100 includes three basic logic elements 1 (hereinafter referred to as basic logic elements 1_1 to 1_3) that perform the same calculation processing in parallel. Note that, in this example, although a description is given of a case in which three basic logic elements 1 that perform the same calculation processing are provided in the redundancy circuit 100, it is sufficient that two or more basic logic elements 1 be provided.

In the redundancy circuit 100, for example, the authority to output data is given to the basic logic element 1_1 among the basic logic elements 1_1 to 1_3. The basic logic element 1_1 to which the authority to output data is given self-diagnoses whether or not there is any abnormality in the own element 1_1, and when it is diagnosed that there is no abnormality, the basic logic element 1_1 outputs a result of the calculation performed by the calculation unit 11 to the outside of the own element 1_1. Note that at this time, the basic logic element 1_1 retains the authority to output data, while the basic logic elements 1_2 and 1_3 do not have the authority to output data. Thus, results of the calculation are not output from the basic logic elements 1_2 and 1_3. Therefore, in the redundancy circuit 100, the output signal of the basic logic element 1_1 is used as a formal output signal.

On the other hand, when it is diagnosed that there is an abnormality in the result of the calculation of the own element 1_1, the basic logic element 1_1 stops outputting the result of the calculation performed by the calculation unit 11 to the outside of the own element 1_1. At this time, the authority to output data retained by the basic logic element 1_1 is abandoned, and then, for example, it is transferred to the basic logic element 1_2. The basic logic element 1_2 to which the authority to output data is given self-diagnoses whether or not there is any abnormality in the own element 1_2, and when it is diagnosed that there is no abnormality, the basic logic element 1_2 outputs the result of the calculation by the calculation unit 11 to the outside of the own element 1_2. Note that at this time, the basic logic element 1_2 retains the authority to output data, while the basic logic elements 1_1 and 1_3 do not have the authority to output data. Thus, results of the calculation are not output from the basic logic elements 1_1 and 1_3. Therefore, in the redundancy circuit 100, the output signal of the basic logic element 1_2 is used as a formal output signal.

Similarly, when it is diagnosed that there is an abnormality in the result of the calculation of the own element 1_2, the basic logic element 1_2 stops outputting the result of the calculation performed by the calculation unit 11 to the outside of the own element 1_2. At this time, the authority to output data retained by the basic logic element 1_2 is abandoned, and then, for example, it is transferred to the basic logic element 1_3. The basic logic element 1_3 to which the authority to output data is given self-diagnoses whether or not there is any abnormality in the own element 1_3, and when it is diagnosed that there is no abnormality, the basic logic element 1_3 outputs the result of the calculation by the calculation unit 11 to the outside of the own element 1_3. Note that at this time, the basic logic element 1_3 retains the authority to output data, while the basic logic elements 1_1 and 1_2 do not have the authority to output data. Thus, results of the calculation are not output from the basic logic elements 1_1 and 1_2. Therefore, in the redundancy circuit 100, the output signal of the basic logic element 1_3 is used as a formal output signal.

As described above, when it is diagnosed by the self-diagnosis that there is an abnormality in the own element, the basic logic element 1 according to this example embodiment stops the output of the result of the calculation, separate the own element (causes the own element to self-purge) from the entire configuration, and transfers the authority to output data to another basic logic element 1. Since the redundancy circuit 100 configured by using the above-described basic logic element 1 does not need to include a majority circuit or the like which is a single failure point, reliability of a circuit can be improved.

Second Example Embodiment

Figure 3:
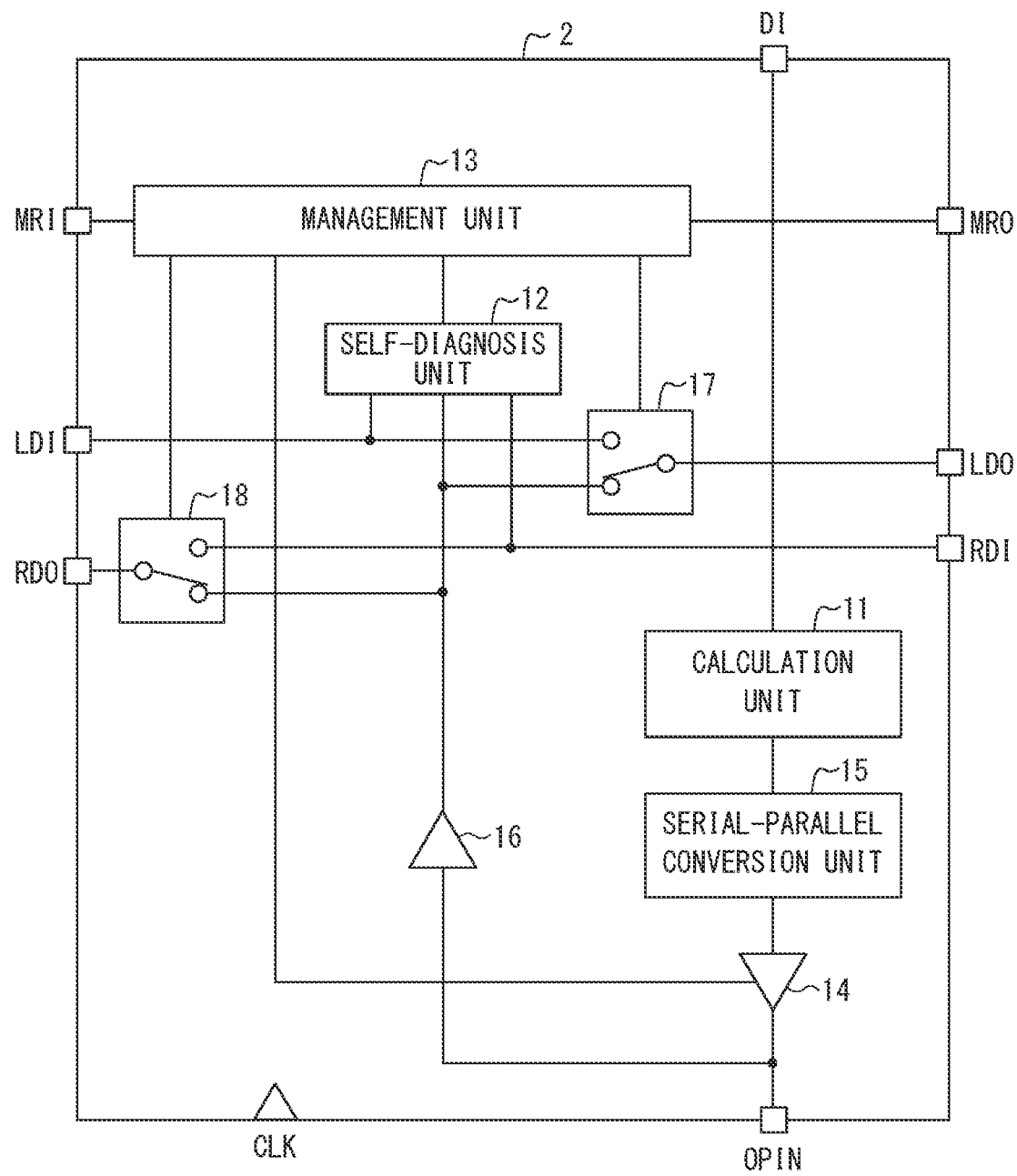
FIG. 3 is a block diagram showing a configuration example of a basic logic element according to a second example embodiment.

FIG. 3 is a block diagram showing a configuration example of a basic logic element 2 according to a second example embodiment.

In the basic logic element 2, the self-diagnosis unit 12 performs self-diagnosis by using not only a result of a calculation (self-diagnosis data) of the own element but also a result of a calculation (self-diagnosis data) output from a basic logic element 2 different from the own element. The details of the above configuration will be described below.

As shown in FIG. 3, the basic logic element 2 includes a serial-parallel conversion unit 15, a buffer 16, and switches 17 and 18 in addition to the configuration of the basic logic element 1. Note that the serial-parallel conversion unit 15 and the buffer 16 perform respective parts of the calculation processing, and may be omitted as necessary.

The serial-parallel conversion unit 15 converts a serial result of the calculation performed by the calculation unit 11 into a parallel one. The output control unit 14 controls whether or not to output the output from the serial-parallel conversion unit 15 from the own element to the outside through the output terminal OPIN. The buffer 16 drives the result of the calculation (more specifically, the output from the serial-parallel conversion unit 15) performed by the calculation unit 11 and outputs it.

The self-diagnosis unit 12 makes a comparison among a result of the calculation (self-diagnosis data) generated in the own element, self-diagnosis data supplied from another basic logic element 2 to an input terminal LDI, and self-diagnosis data supplied from yet another basic logic element 2 to an input terminal RDI. Then the self-diagnosis unit 12 diagnoses whether or not there is any abnormality in the result of the calculation output from the own element to the outside through the output terminal OPIN based on a result of the comparison. Hereinafter, a basic logic element 2 which is different from the own element and which supplies self-diagnosis data to the input terminal LDI of the own element is referred to as a first another basic logic element 2, and a basic logic element 2 which is different from the own element and which supplies self-diagnosis data to the input terminal RDI of the own element is referred to as a second another basic logic element 2.

For example, when the self-diagnosis data generated in the own element indicates a value having a majority of three pieces of the self-diagnosis data, the self-diagnosis unit 12 diagnoses that there is no abnormality in the result of the calculation output from the own element to the outside through the output terminal OPIN. On the other hand, when the self-diagnosis data generated in the own element does not indicate the value having a majority of three pieces of the self-diagnosis data, the self-diagnosis unit 12 diagnoses that there is an abnormality in the result of the calculation output from the own element to the outside through the output terminal OPIN.

Note that, in this example embodiment, although a description is given of a case in which the self-diagnosis unit 12 compares the self-diagnosis data generated in the own element with the self-diagnosis data output from each of the two basic logic elements 2 different from the own element, the present disclosure is not limited thereto. The configuration of the self-diagnosis unit 12 can be appropriately changed to one in which two or more pieces of self-diagnosis data including self-diagnosis data generated in the own element are compared with each other.

The management unit 13 manages whether or not to retain authority (authority to output data) to output a result of the calculation performed by the own element.

For example, the management unit 13 can obtain the authority to output data by receiving the authority signal MRI indicating that the authority to output data is abandoned (in other words, the authority to output data is transferred) from the first another basic logic element 2. The management unit 13 then determines whether or not to continue retaining the authority to output data based on a result of the self-diagnosis performed by the self-diagnosis unit 12.

For example, when the self-diagnosis unit 12 has diagnosed that there is no abnormality in the result of the calculation of the own element, the management unit 13 continues retaining the authority to output data, while when the self-diagnosis unit 12 has diagnosed that there is an abnormality in the result of the calculation of the own element, the management unit 13 abandons the authority to output data without retaining it. The management unit 13 then outputs the authority signal MRO indicating whether or not to retain the authority to output data to the second another basic logic element 2.

Further, the management unit 13 controls switching of the switches 17 and 18 based on a result of the self-diagnosis performed by the self-diagnosis unit 12. The switch 17 selects either the self-diagnosis data generated in the own element or the self-diagnosis data supplied from the first another basic logic element 2 to the input terminal LDI and outputs the selected self-diagnosis data. The switch 18 selects either the self-diagnosis data generated in the own element or the self-diagnosis data supplied from the second another basic logic element 2 to the input terminal RDI and outputs the selected self-diagnosis data.

For example, when the self-diagnosis unit 12 has diagnosed that there is no abnormality in the result of the calculation of the own element, the switch 17 selects the self-diagnosis data generated in the own element and outputs the selected self-diagnosis data to the second another basic logic element 2 through an output terminal LDO. Further, at this time, the switch 18 selects the self-diagnosis data generated in the own element and outputs the selected self-diagnosis data to the first another basic logic element 2 through an output terminal RDO.

On the other hand, when the self-diagnosis unit 12 has diagnosed that there is an abnormality in the result of the calculation of the own element, the switch 17 selects the self-diagnosis data supplied from the first another basic logic element 2 to the input terminal LDI, and outputs the selected self-diagnosis data to the second another basic logic element 2 through the output terminal LDO. Further, at this time, the switch 18 selects the self-diagnosis data supplied from the second another basic logic element 2 to the input terminal RDI and outputs the selected self-diagnosis data to the first another basic logic element 2 through the output terminal RDO.

That is, the basic logic element 2 does not output the self-diagnosis data generated in the own element to another basic logic element 2 when the self-diagnosis unit 12 has diagnosed that there is an abnormality in the result of the calculation of the own element. At this time, the basic logic element 2 outputs, instead of the self-diagnosis data generated in the own element, the self-diagnosis data of the first another basic logic element 2 to the second another basic logic element 2 through the own element. Further, the basic logic element 2 outputs, instead of the self-diagnosis data generated in the own element, the self-diagnosis data of the second another basic logic element 2 to the first another basic logic element 2 through the own element.

In other words, the basic logic element 2 propagates the self-diagnosis data generated in the own element to the second another basic logic element 2 (on the right side) in a state in which the own element is not separated from the redundant configuration based on the result of the diagnosis that there is no abnormality in the own element. On the other hand, when the basic logic element 2 is separated from the redundant configuration based on the result of the diagnosis that there is an abnormality in the own element, the basic logic element 2 bypasses itself and propagates the self-diagnosis data input from the first another basic logic element 2 (on the left side) to the second another basic logic element 2 (on the right side). Similarly, the basic logic element 2 propagates the self-diagnosis data generated in the own element to the first another basic logic element 2 (on the left side) in a state in which the own element is not separated from the redundant configuration based on the result of the diagnosis that there is no abnormality in the own element. On the other hand, when the basic logic element 2 is separated from the redundant configuration based on the result of the diagnosis that there is an abnormality in the own element, the basic logic element 2 bypasses itself and propagates the self-diagnosis data input from the second another basic logic element 2 (on the right side) to the first another basic logic element 2 (on the left side).

The configurations of the basic logic element 2 other than the above ones are similar to those of the basic logic element 1, and thus the descriptions thereof will be omitted.

«Example of Specific Configuration of Basic Logic Element 2»

Figure 4:
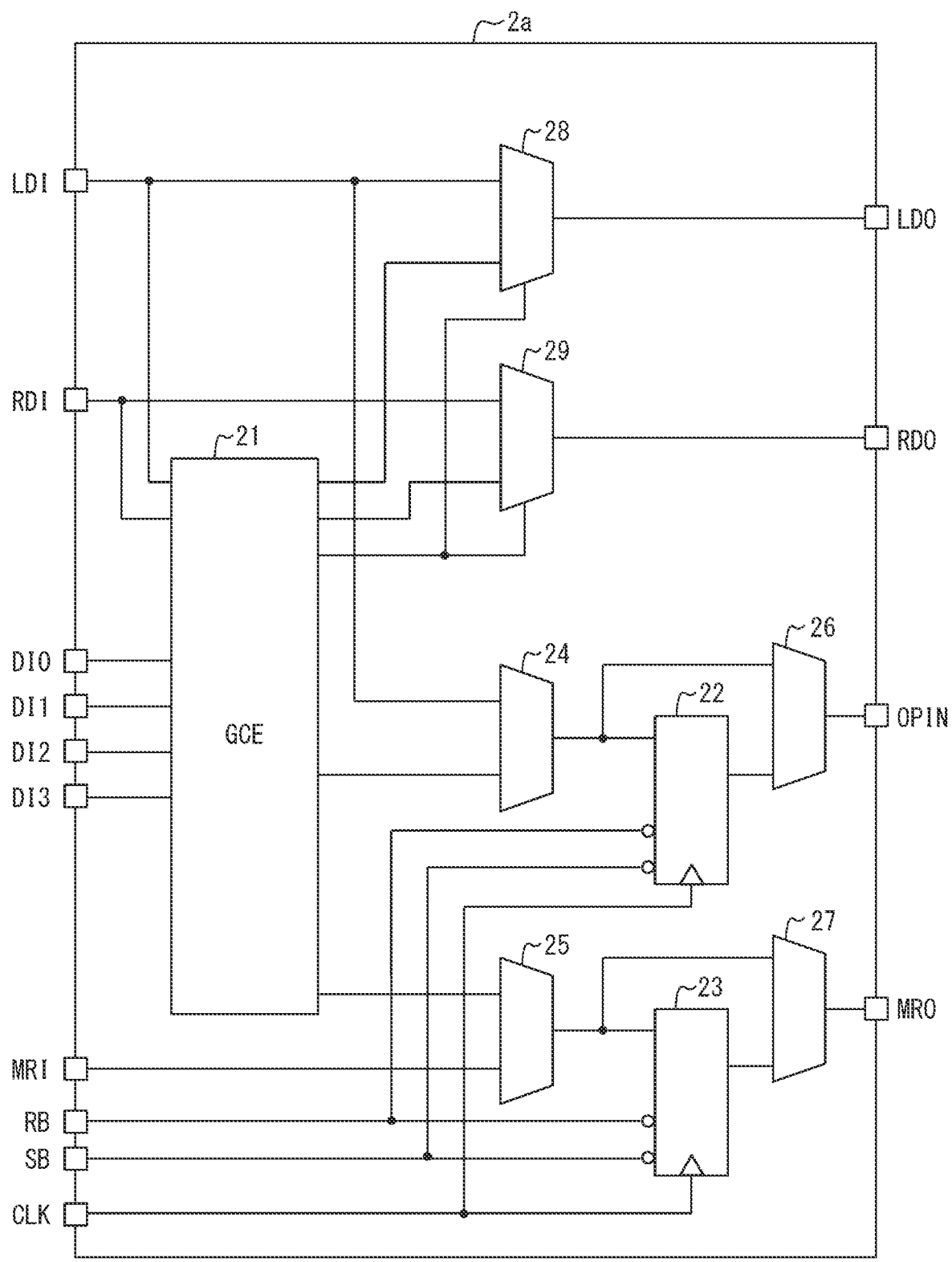
FIG. 4 is a diagram showing a specific configuration example of the basic logic element shown in FIG. 3.

FIG. 4 is a diagram showing a specific configuration example of the basic logic element 2 as a basic logic element 2*a*.

As shown in FIG. 4, the basic logic element 2*a* includes a Generic Core Element (GCE) 21, flip-flops 22 and 23, and selectors 24 to 29.

Note that the GCE 21 has a function of a part of the management unit 13, a function of the self-diagnosis unit 12, and a function of the calculation unit 11 shown in FIG. 3. A circuit group including the selectors 24 and 26 and the flip-flop 22 has, for example, the function of the output control unit 14 shown in FIG. 3. A circuit group including the selectors 25 and 27 and the flip-flop 23 has, for example, the function of part of the management unit 13 shown in FIG. 3. The selector 28 corresponds to the switch 17 shown in FIG. 3. The selector 29 corresponds to the switch 18 shown in FIG. 3.

The GCE 21 performs calculation processing on the input signals DI0 to DI4 as the function of the calculation unit 11, and outputs a result of the calculation. The GCE 21 may, instead of being a lookup table, be a calculator such as an MCU, a DSP, or a VPE.

Further, as the function of the self-diagnosis unit 12, the GCE 21 makes a comparison among the self-diagnosis data generated in the own element, the self-diagnosis data supplied from the first another basic logic element 2 to the input terminal LDI, and the self-diagnosis data supplied from the second another basic logic element 2 to the input terminal RDI. Then the GCE 21 diagnoses whether or not there is any abnormality in the result of the calculation output from the own element based on a result of the comparison.

Further, the GCE 21 manages whether or not to retain the authority to output data as the function of the management unit 13. For example, when the GCE 21 receives the authority signal MRI indicating that the authority to output data is abandoned from the first another basic logic element 2, the GCE 21 causes the flip-flop 23 to retain the authority to output data by switching the selection of the selector 25. The GCE 21 then determines whether or not to continue retaining the authority to output data based on a result of the self-diagnosis.

For example, when it is diagnosed that there is no abnormality in the result of the calculation of the own element, the GCE 21 causes the flip-flop 23 to continue retaining the authority to output data, while when it is diagnosed that there is an abnormality, the GCE 21 causes the flip-flop 23 to abandon the authority to output data retained therein. The output from the flip-flop 23 is output as the authority signal MRO to, for example, the second another basic logic element 2. Note that when it is diagnosed that there is an abnormality in the result of the calculation of the own element, the GCE 21 can also output the authority signal MRI as the authority signal MRO as it is without using the flip-flop 23 by switching the selection of the selector 27.

Further, the GCE 21 controls switching of the selectors 28 and 29 based on a result of the self-diagnosis as the function of the management unit 13. The selector 28 selects either the self-diagnosis data generated in the own element or the self-diagnosis data supplied from the first another basic logic element 2 to the input terminal LDI, and outputs the selected self-diagnosis data to the second another basic logic element 2 through the output terminal LDO. The selector 29 selects either the self-diagnosis data generated in the own element or the self-diagnosis data supplied from the second another basic logic element 2 to the input terminal RDI, and outputs the selected data to the first another basic logic element 2 through the output terminal RDO. The respective operations of the selectors 28 and 29 other than the above ones are similar to those of the switches 17 and 18, and thus the descriptions thereof will be omitted.

The circuit group including the selectors 24 and 26 and the flip-flop 22 controls, as the function of the output control unit 14, whether or not to output a result of the calculation performed by the GCE 21 to the outside of the own element according to whether or not the authority to output data is retained in the flip-flop 23. The operations of the circuit group including the selectors 24 and 26 and the flip-flop 22 other than the above ones are similar to those of the output control unit 14, and thus the descriptions thereof will be omitted.

Note that the specific configuration of the basic logic element 2 is not limited to the configuration shown in FIG. 3, and may be appropriately changed to another configuration in which a function equivalent to that of the configuration shown in FIG. 3 can be implemented.

«Configuration Example of Redundancy Circuit 200 Using Basic Logic Element 2»

Figure 5:
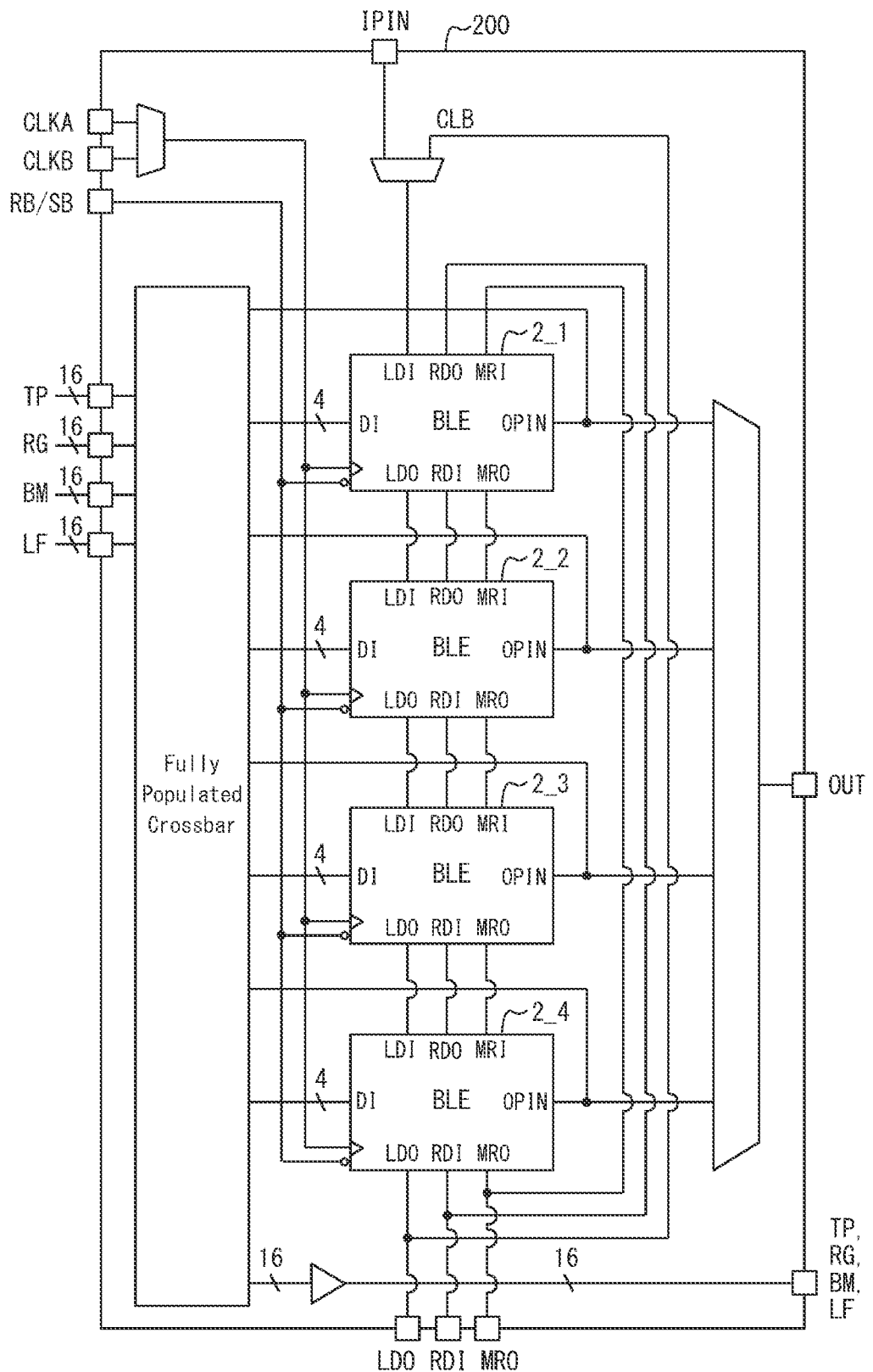
FIG. 5 is a block diagram showing a configuration example of a redundancy circuit using the basic logic element shown in FIG. 3.

FIG. 5 is a block diagram showing a configuration example of a redundancy circuit 200 using the basic logic element 2. The redundancy circuit 200 includes at least four basic logic elements 2 (hereinafter referred to as basic logic elements 2_1 to 2_4) that perform the same calculation processing in parallel. Note that, in this example, although a description is given of a case in which four basic logic elements 2 that perform the same calculation processing are provided in the redundancy circuit 200, it is sufficient that two or more basic logic elements 2 be provided.

In the redundancy circuit 200, for example, the authority to output data is given to the basic logic element 2_1 among the basic logic elements 2_1 to 2_4. The basic logic element 2_1 to which the authority to output data is given compares the self-diagnosis data generated in the own element with the self-diagnosis data output from each of the basic logic elements 2_4 and 2_2, thereby performing self-diagnosis whether or not there is any abnormality in the own element. Here, when it is diagnosed that there is no abnormality, the basic logic element 2_1 outputs a result of the calculation to the outside of the own element. At this time, the basic logic element 2_1 retains the authority to output data, while the basic logic elements 2_2 to 2_4 do not have the authority to output data. Thus, results of the calculation are not output from the basic logic elements 2_2 to 2_4. Therefore, in the redundancy circuit 200, the output signal of the basic logic element 2_1 is used as a formal output signal.

On the other hand, when it is diagnosed that there is an abnormality in the result of the calculation of the own element, the basic logic element 2_1 stops the output of the result of the calculation of the own element. At this time, the authority to output data retained by the basic logic element 2_1 is abandoned, and then, for example, it is transferred to the basic logic element 2_2. The basic logic element 2_2 to which the authority to output data is given compares the self-diagnosis data generated in the own element with the self-diagnosis data output from each of the basic logic elements 2_1 and 2_3, thereby performing self-diagnosis whether or not there is any abnormality in the own element. Here, when it is diagnosed that there is no abnormality, the basic logic element 2_2 outputs a result of the calculation to the outside of the own element. At this time, the basic logic element 2_2 retains the authority to output data, while the basic logic elements 2_1, 2_3, and 2_4 do not have the authority to output data. Thus, results of the calculation are not output from the basic logic elements 2_1, 2_3, and 2_4. Therefore, in the redundancy circuit 200, the output signal of the basic logic element 2_2 is used as a formal output signal.

Similarly, when it is diagnosed that there is an abnormality in the result of the calculation of the own element, the basic logic element 1_2 stops outputting the result of the calculation performed by the calculation unit 11 to the outside of the own element. At this time, the authority to output data retained by the basic logic element 1_2 is abandoned, and then, for example, it is transferred to the basic logic element 1_3. The operations of the basic logic elements 2_3 and 2_4 other than the above ones are basically similar to those of the basic logic element 2_1, and thus the descriptions thereof will be omitted.

As described above, when it is diagnosed by the self-diagnosis that there is an abnormality in the own element, the basic logic element 2 according to this example embodiment stops the output of the result of the calculation, separate the own element (causes the own element to self-purge) from the entire configuration, and transfers the authority to output data to another basic logic element 2. Since the redundancy circuit 200 configured by using the above-described basic logic element 2 does not need to include a majority circuit or the like which is a single failure point, reliability of a circuit can be improved.

In particular, when a spacecraft-mounted FPGA, which is required to have a high radiation resistance, is developed using a consumer product in order to reduce costs, a high reliability of a circuit can be maintained by using a redundancy circuit configured by using the basic logic element 1 or 2 without significantly changing a circuit technology of the consumer product.

Although the example embodiments of the present disclosure have been described in detail with reference to the drawings, the specific configurations are not limited to those described above, and various design changes and the like can be made without departing from the scope and spirit of the present disclosure.

In the first and the second example embodiments, a description has been given of an example in which the basic logic elements 1 and 2 are used for some or all of a plurality of basic logic elements provided on the FPGA. The basic logic elements 1 and 2 may be used, for example, for some or all of a plurality of basic logic elements provided in a Dynamic Reconfigurable Processor (DRP).

Further, processing for implementing a predetermined circuit configuration by switching a connection relation among a plurality of basic logic elements 1 (or basic logic elements 2) provided in the FPGA or the dynamic reconfigurable processor can be implemented by causing a CPU to execute a computer program. Note that the CPU is an abbreviation for Central Processing Unit.

Further, the above-described program can be stored and provided to a computer using any type of non-transitory computer readable media. Non-transitory computer readable media include any type of tangible storage media. Examples of non-transitory computer readable media include magnetic storage media, optical magnetic storage media, CD-ROM (Read Only Memory), CD-R, CD-R/W, and semiconductor memories (such as mask ROM, PROM (Programmable ROM), EPROM (Erasable PROM), flash ROM, RAM (Random Access Memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g., electric wires, and optical fibers) or a wireless communication line.

The whole or part of the example embodiments disclosed above can be described as, but not limited to, the following supplementary notes.

(Supplementary Note 1)

A basic logic element comprising:
- a calculation unit configured to perform calculation processing;
- a self-diagnosis unit configured to self-diagnose whether or not there is an abnormality in a result of the calculation output from the basic logic element;
- a management unit configured to determine whether or not to retain authority to output the result of the calculation based on a result of the diagnosis performed by the self-diagnosis unit and outputting a result of the determination as an authority signal; and
- an output control unit configured to control whether or not to output the result of the calculation performed by the calculation unit based on whether or not the authority to output the result of the calculation is retained by the management unit.

(Supplementary Note 2)

The basic logic element according to Supplementary note 1, wherein
the management unit is configured to retain the authority to output the result of the calculation when the self-diagnosis unit has diagnosed that there is no abnormality in the result of the calculation, and to abandon the authority to output the result of the calculation without retaining the authority to output the result of the calculation when the self-diagnosis unit has diagnosed that there is an abnormality in the result of the calculation, and
the output control unit is configured to output the result of the calculation performed by the calculation unit when the authority to output the result of the calculation is retained by the management unit, and to stop the output of the result of the calculation performed by the calculation unit when the authority to output the result of the calculation has been abandoned by the management unit.

(Supplementary Note 3)

The basic logic element according to Supplementary note 1 or 2, wherein the management unit is configured to retain the authority to output the result of the calculation by receiving the authority signal indicating that the authority to output the result of the calculation has been abandoned from a basic logic element different from the basic logic element.

(Supplementary Note 4)

The basic logic element according to any one of Supplementary notes 1 to 3, wherein the self-diagnosis unit is configured to self-diagnose whether or not there is an abnormality in the result of the calculation output from the basic logic element by comparing self-diagnosis data obtained from the result of the calculation performed by the calculation unit with self-diagnosis data output from at least one basic logic element different from the basic logic element.

(Supplementary Note 5)

The basic logic element according to Supplementary note 4, wherein the self-diagnosis unit is configured to self-diagnose whether or not there is an abnormality in the result of the calculation output from the basic logic element based on whether or not the self-diagnosis data obtained from the result of the calculation performed by the calculation unit indicates a value having a majority of the self-diagnosis data obtained from the result of the calculation performed by the calculation unit and the self-diagnosis data output from the at least one basic logic element different from the basic logic element.

(Supplementary Note 6)

The basic logic element according to Supplementary note 4 or 5, wherein the management unit is configured to output, instead of the self-diagnosis data of the basic logic element, the self-diagnosis data output from the at least one basic logic element different from the basic logic element when the self-diagnosis unit has diagnosed that there is an abnormality in the result of the calculation.

(Supplementary Note 7)

The basic logic element according to any one of Supplementary notes 1 to 6, wherein the basic logic element is used for at least one of a plurality of basic logic elements provided on a Field Programmable Gate Array (FPGA).

(Supplementary Note 8)

The basic logic element according to any one of Supplementary notes 1 to 6, wherein the basic logic element is used for at least one of a plurality of basic logic elements provided in a dynamic reconfigurable processor.

(Supplementary Note 9)

A semiconductor device comprising a plurality of basic logic elements provided in parallel, each of the plurality of basic logic elements comprising:
- a calculation unit configured to perform calculation processing;
- a self-diagnosis unit configured to self-diagnose whether or not there is an abnormality in a result of the calculation output from the basic logic element;
- a management unit configured to determine whether or not to retain authority to output the result of the calculation based on a result of the diagnosis performed by the self-diagnosis unit and outputting a result of the determination as an authority signal; and
- an output control unit configured to control whether or not to output the result of the calculation performed by the calculation unit based on whether or not the authority to output the result of the calculation is retained by the management unit.

(Supplementary Note 10)

The semiconductor device according to Supplementary note 9, wherein
in each of the plurality of basic logic elements,
the management unit is configured to retain the authority to output the result of the calculation when the self-diagnosis unit has diagnosed that there is no abnormality in the result of the calculation, and to abandon the authority to output the result of the calculation without retaining the authority to output the result of the calculation when the self-diagnosis unit has diagnosed that there is an abnormality in the result of the calculation, and
the output control unit is configured to output the result of the calculation performed by the calculation unit when the authority to output the result of the calculation is retained by the management unit, and to stop the output of the result of the calculation performed by the calculation unit when the authority to output the result of the calculation has been abandoned by the management unit.

(Supplementary Note 11)

The semiconductor device according to Supplementary note 9 or 10, wherein in each of the plurality of basic logic elements, the management unit is configured to retain the authority to output the result of the calculation by receiving the authority signal indicating that the authority to output the result of the calculation has been abandoned from a basic logic element different from the basic logic element.

(Supplementary Note 12)

The semiconductor device according to any one of Supplementary notes 9 to 11, wherein in each of the plurality of basic logic elements, the self-diagnosis unit is configured to self-diagnose whether or not there is an abnormality in the result of the calculation output from the basic logic element by comparing self-diagnosis data obtained from the result of the calculation performed by the calculation unit with self-diagnosis data output from at least one basic logic element different from the basic logic element.

(Supplementary Note 13)

The semiconductor device according to Supplementary note 12, wherein in each of the plurality of basic logic elements, the self-diagnosis unit is configured to self-diagnose whether or not there is an abnormality in the result of the calculation output from the basic logic element based on whether or not the self-diagnosis data obtained from the result of the calculation performed by the calculation unit indicates a value having a majority of the self-diagnosis data obtained from the result of the calculation performed by the calculation unit and the self-diagnosis data output from the at least one basic logic element different from the basic logic element.

(Supplementary Note 14)

The semiconductor device according to Supplementary note 12 or 13, wherein in each of the plurality of basic logic elements, the management unit is configured to output, instead of the self-diagnosis data of the basic logic element, the self-diagnosis data output from the at least one basic logic element different from the basic logic element when the self-diagnosis unit has diagnosed that there is an abnormality in the result of the calculation.

(Supplementary Note 15)

The semiconductor device according to any one of Supplementary notes 9 to 14, wherein the plurality of basic logic elements are part of a plurality of basic logic elements provided on a Field Programmable Gate Array (FPGA).

(Supplementary Note 16)

The semiconductor device according to any one of Supplementary notes 9 to 14, wherein the plurality of basic logic elements are part of a plurality of basic logic elements provided in a dynamic reconfigurable processor.

(Supplementary Note 17)

An output control method for a basic logic element, the output control method comprising:
performing calculation processing;
self-diagnosing whether or not there is an abnormality in a result of the calculation;
determining whether or not to retain authority to output the result of the calculation based on a result of the diagnosis and outputting a result of the determination as an authority signal; and
controlling whether or not to output the result of the calculation based on whether or not the authority to output the result of the calculation is retained.

(Supplementary Note 18)

A control program for causing a computer to execute processing for constituting a predetermined circuit by combining a plurality of basic logic elements, each of the plurality of basic logic elements comprising: a calculation unit configured to perform calculation processing; a self-diagnosis unit configured to self-diagnose whether or not there is an abnormality in a result of the calculation output from the basic logic element; a management unit configured to determine whether or not to retain authority to output the result of the calculation based on a result of the diagnosis performed by the self-diagnosis unit and outputting a result of the determination as an authority signal; and an output control unit configured to control whether or not to output the result of the calculation performed by the calculation unit based on whether or not the authority to output the result of the calculation is retained by the management unit.

Although the present disclosure has been described with reference to the example embodiments, the present disclosure is not limited to the above-described example embodiments. Various modifications that may be understood by those skilled in the art may be made to the configurations and details of the present disclosure within the scope of the disclosure.

This application is based upon and claims the benefit of priority from Japanese patent application No. 2019-085330, filed on Apr. 26, 2019, the disclosure of which is incorporated herein in its entirety by reference.

REFERENCE SIGNS LIST

1 BASIC LOGIC ELEMENT
1_1 TO 1_3 BASIC LOGIC ELEMENT
2 BASIC LOGIC ELEMENT
2a BASIC LOGIC ELEMENT
2_1 TO 2_4 BASIC LOGIC ELEMENT
11 CALCULATION UNIT
12 SELF-DIAGNOSIS UNIT
13 MANAGEMENT UNIT
14 OUTPUT CONTROL UNIT
15 SERIAL-PARALLEL CONVERSION UNIT
16 BUFFER
17 SWITCH
18 SWITCH
21 GCE
22 FLIP-FLOP
23 FLIP-FLOP
24 TO 29 SELECTOR
100 REDUNDANCY CIRCUIT
200 REDUNDANCY CIRCUIT

What is claimed is:

1. A basic logic element comprising:
one or more processors; and
a memory storing instructions executable by the one or more processors to:
perform calculation processing on an input signal, yielding a calculation result;
self-diagnose whether or not there is an abnormality in the calculation result;
retain or relinquish authority to output the calculation result based on whether or not the abnormality has been self-diagnosed in the calculation result;
in response to the authority having been retained, output the calculation result; and
in response to the authority having been relinquished, not output the calculation result.

2. The basic logic element according to claim 1, wherein
the authority to output the calculation result is retained when no abnormality has been self-diagnosed in the calculation result, and
the authority to output the calculation result is relinquished when the abnormality has been self-diagnosed in the calculation result.

3. The basic logic element according to claim 1, wherein the instructions are executable by the one or more processors to further:
retain the authority to output the calculation result in response to receiving an authority signal indicating that a different base logic element has relinquished the authority to output the calculation result.

4. The basic logic element according to claim 1, wherein whether or not there is the abnormality in the calculation result is self-diagnosed by comparing first self-diagnosis data obtained from the calculation result with second self-diagnosis data received from each of at least one different basic logic element.

5. The basic logic element according to claim 4, wherein whether or not there is the abnormality in the calculation result is self-diagnoses based on whether or not the first self-diagnosis indicates a value indicated by a majority of the first self-diagnosis data and the second self-diagnosis data output from each of the at least one different basic logic element.

6. The basic logic element according to claim 4, wherein the instructions are executable by the one or more processors to further:
in response to having self-diagnosed the abnormality in the calculation result, output the second self-diagnosis data received from each the at least one different basic logic element.

7. The basic logic element according to claim 1, wherein the basic logic element is used for at least one of a plurality of basic logic elements provided on a Field Programmable Gate Array (FPGA).

8. The basic logic element according to claim 1, wherein the basic logic element is used for at least one of a plurality of basic logic elements provided in a dynamic reconfigurable processor.

9. A semiconductor device comprising a plurality of basic logic elements provided in parallel, each of the plurality of basic logic elements comprising:
one or more processors; and
a memory storing instructions executable by the one or more processors to:
perform calculation processing on an input signal, yielding a calculation result;
self-diagnose whether or not there is an abnormality in the calculation result;
retain or relinquish authority to output the calculation result of the calculation based on whether or not the abnormality has been self-diagnosed in the calculation result;
in response to the authority having been retained, output the calculation result; and
in response to the authority having been relinquished, not output the calculation result.

10. The semiconductor device according to claim 9, wherein
in each of the plurality of basic logic elements,
the authority to output the calculation result is retained when no abnormality has been self-diagnosed in the calculation result, and
the authority to output the calculation result is relinquished when the abnormality the has been self-diagnosed in the calculation result.

11. The semiconductor device according to claim 9, wherein in each of the plurality of basic logic elements, the instructions are executable by the one or more processors to further:
retain the authority to output the calculation result in response to receiving an authority signal indicating that a different base logic element has relinquished the authority to output the calculation result.

12. The semiconductor device according to claim 9, wherein in each of the plurality of basic logic elements, whether or not there is the abnormality in the calculation result is self-diagnosed by comparing first self-diagnosis data obtained from the calculation result with second self-diagnosis data received from each of at least one different basic logic element.

13. The semiconductor device according to claim 12, wherein in each of the plurality of basic logic elements, whether or not there is the abnormality in the calculation result is self-diagnoses based on whether or not the first self-diagnosis indicates a value indicated by a majority of the first self-diagnosis data and the second self-diagnosis data output from each of the at least one different basic logic element.

14. The semiconductor device according to claim 12, wherein in each of the plurality of basic logic elements, wherein the instructions are executable by the one or more processors to further:
in response to having self-diagnosed the abnormality in the calculation result, output the second self-diagnosis data received from each the at least one different basic logic element.

15. The semiconductor device according to claim 9, wherein the plurality of basic logic elements are part of a plurality of basic logic elements provided on a Field Programmable Gate Array (FPGA).

16. The semiconductor device according to claim 9, wherein the plurality of basic logic elements are part of a plurality of basic logic elements provided in a dynamic reconfigurable processor.

17. An output control method executable by a basic logic element, the output control method comprising:
performing calculation processing on an input signal, yielding a calculation result;
self-diagnosing whether or not there is an abnormality in the calculation result;
retaining or relinquishing authority to output the result of the calculation result based on whether or not the abnormality has been self-diagnosed in the calculation result;
in response to the authority having been retained, outputting the calculation result; and
in response to the authority having been relinquished, not outputting the calculation result.

18. A non-transitory computer readable medium storing a control program executable by a basic logic element to perform processing comprising:
performing calculation processing on an input signal, yielding a calculation result;
self-diagnosing whether or not there is an abnormality in the calculation result;
retaining or relinquishing authority to output the result of the calculation result based on whether or not the abnormality has been self-diagnosed in the calculation result;
in response to the authority having been retained, outputting the calculation result; and
in response to the authority having been relinquished, not outputting the calculation result.

* * * * *